(12) United States Patent
Goruganthu et al.

(10) Patent No.: US 6,277,656 B1
(45) Date of Patent: Aug. 21, 2001

(54) SUBSTRATE REMOVAL AS A FUNCTION OF ACOUSTIC ANALYSIS

(76) Inventors: Rama R. Goruganthu, 14572 Robert I Walker, Austin, TX (US) 78728; Jeffrey D. Birdsley, 11250 Taylor Draper La. #1326, Austin, TX (US) 78759; Michael R. Bruce, 4105 Paseo Dr., Austin, TX (US) 78739; Brennan V. Davis, 204 Sailor's Run, Austin, TX (US) 78734; Rosalinda M. Ring, 8608 Devine La., Austin, TX (US) 78748

( * ) Notice: Subject to any disclaimer, the term of this patent is extended or adjusted under 35 U.S.C. 154(b) by 0 days.

(21) Appl. No.: 09/410,145

(22) Filed: Sep. 30, 1999

(51) Int. Cl.$^7$ .................................................. H01L 21/00
(52) U.S. Cl. .................................. 438/4; 438/12; 438/16; 438/7
(58) Field of Search .......................... 438/4, 12, 7, 660, 438/661, 659; 356/381, 432, 562; 73/651, 652, 655; 367/150

(56) References Cited

U.S. PATENT DOCUMENTS

| | | | |
|---|---|---|---|
| 4,504,727 | * | 3/1985 | Melcher et al. ..................... 219/121 |
| 5,003,516 | * | 3/1991 | Sato et al. ............................ 367/150 |
| 5,196,006 | * | 3/1993 | Klopotek et al. ...................... 606/12 |
| 5,608,526 | | 3/1997 | Piwonka-Corle et al. . |
| 5,633,747 | | 5/1997 | Nikoonahad . |
| 5,748,318 | * | 5/1998 | Maris et al. ......................... 356/381 |
| 5,771,094 | | 6/1998 | Carter et al. . |
| 5,840,023 | | 11/1998 | Oraevsky et al. . |
| 5,959,735 | * | 8/2000 | Maris et al. ......................... 356/381 |
| 6,092,422 | * | 7/2000 | Binnig et al. .......................... 73/651 |
| 6,103,539 | * | 8/2000 | Schaffer et al. ......................... 438/4 |

OTHER PUBLICATIONS

A. Grossman et al., "A new millimeter free electron laser using a relativistic beam with spiraling electrons," Phys. Fluids 26(1), Jan. 1983, 1983 American Insititute of Physics, pp. 337–343.

S.T. Zavtrak, "Free gas bubbles acoustic laser," The Institute of Nuclear Problems, Bobruiskaya Str., 11, Minsk 220050, Belarus, 1995 Elsevier Science B.V., A358(1995) pp. 473–474.

* cited by examiner

*Primary Examiner*—Charles Bowers
*Assistant Examiner*—Laura M. Schillinger

(57) ABSTRACT

A substrate removal approach involves sensing acoustic energy in an integrated circuit as a function of substrate in the integrated circuit being removed. According to an example embodiment of the present invention, a method for substrate removal includes removing a portion of substrate from the back side of a semiconductor chip circuitry near a circuit side and opposite the back side. The substrate is removed as a function of detected acoustic energy propagating through the device. The detected acoustic energy can be correlated to a parameter and used for controlling the substrate removal process, improving the ability to efficiently and accurately test semiconductor devices.

15 Claims, 4 Drawing Sheets

SUBSTRATE REMOVAL AS A FUNCTION OF ACOUSTIC ANALYSIS

FIELD OF THE INVENTION

The present invention relates generally to semiconductor chips and their fabrication and, more particularly, to semiconductor chips and their manufacture involving substrate removal.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

To increase the number of pad sites available for a die, to reduce the electrical path to the pad sites, and to address other problems, various chip packaging techniques have been developed. One of these techniques is referred to as controlled collapse chip connection or "flip-chip" packaging. With packaging technology, bonding pads of the die include metal (solder) bumps. Electrical connection to the package is made when the die is "flipped" over and soldered to the package. Each bump connects to a corresponding package inner lead. The resulting packages are low profile and have low electrical resistance and a short electrical path. The output terminals of the package, which are sometimes ball-shaped conductive bump contacts, are typically disposed in a rectangular array. These packages are occasionally referred to as "Ball Grid Array" (BGA) packages. Alternatively, the output terminals of the package may be pins and such packages are commonly known as pin grid array (PGA) packages.

Once the die is attached to such a package the back side portion of the die remains exposed. The transistors and other circuitry are generally formed in a very thin epitaxially-grown silicon layer on a single crystal silicon wafer from which the die is singulated. The side of the die including the epitaxial layer containing the transistors and other circuitry is often referred to as the circuit side or front side of the die. The circuit side of the die is positioned very near the package and opposes the back side of the die. Between the back side and the circuit side of the die is single crystalline silicon.

The positioning of the circuit side near the package provides many advantages. However, in some instances orienting the die with the circuit side face down on a substrate is disadvantageous. Due to this orientation of the die, the transistors and circuitry near the circuit side are not directly accessible for testing, modification or other purposes. Therefore, access to the transistors and circuitry near the circuit side is from the back side of the chip.

For flip-chips and other dies requiring or benefiting from back side access, techniques have been developed to access the circuit even though the integrated circuit (IC) is buried under the bulk silicon. For example, near-infrared (nIR) microscopy is capable of imaging the circuit because silicon is relatively transparent in these wavelengths of the radiation. However, because of the absorption losses of nIR radiation in silicon, it is generally required to thin the die to less than 100 microns in order to view the circuit using nIR microscopy. For a die that is 725 microns thick, at least 625 microns of silicon is removed before nIR microscopy can be used.

Thinning the die for failure analysis of an IC requiring or benefiting from back side access is usually accomplished by first globally thinning, wherein the silicon is thinned across the entire die surface. The silicon is globally thinned to allow viewing of the active circuit from the back side of the die using nIR microscopy. Mechanical polishing is one method for global thinning. Using nIR microscopy, an area is identified for accessing to a particular area of the circuit. Local thinning techniques such as laser microchemical etching are used to thin the silicon an area to a level that is thinner than the die size. One method for laser microchemical etching of silicon is accomplished by focusing a laser beam on the back side of the silicon surface to cause local melting of silicon in the presence of chlorine gas. The molten silicon reacts very rapidly with chlorine and forms silicon tetrachloride gas, which leaves the molten (reaction) zone. A specific example silicon-removal process uses the 9850 SiliconEtcher™ tool by Revise, Inc. (Burlington, Mass.) This laser process is suitable for both local and global thinning by scanning the laser over a part of, or the whole, die surface.

During failure analysis, or for design debug, it is sometimes desirable to make electrical contact and probe certain circuit nodes on the circuit side or front side of the die, or to reconfigure the conductors in an integrated circuit. For a flip chip or other die requiring or benefiting from back side access, this would generally involve milling through the back side of the die to access the node, or milling to the node and subsequently depositing a metal on the node. Accurate determination of the thickness of the silicon in the back side, however, is not readily achieved, making the milling process difficult to control. When not controlled properly, milling through the back side can result in destruction of the circuitry that is to be analyzed or debugged.

SUMMARY OF THE INVENTION

The present invention is exemplified in a number of implementations and applications, some of which are summarized below. According to an example embodiment, the present invention is directed to a method for removing substrate from a semiconductor chip having a back side opposite circuitry near a circuit side. A portion of substrate in the back side of the semiconductor chip is removed as a function of acoustic energy propagating through the device.

According to another example embodiment of the present invention, a system is configured and arranged to remove substrate from a semiconductor chip having a back side opposite circuitry near a circuit side. An ion bombardment device that is controlled by a controller is used to remove substrate from the back side of the chip. A laser device is used to generate acoustic energy in the chip, and a detection device is configured and arranged to detect the acoustic energy. A computer arrangement is coupled to the detection device and to the controller, and configured and arranged to interpret a detected acoustic energy and to send a signal to the controller responsive to the interpreted acoustic energy.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
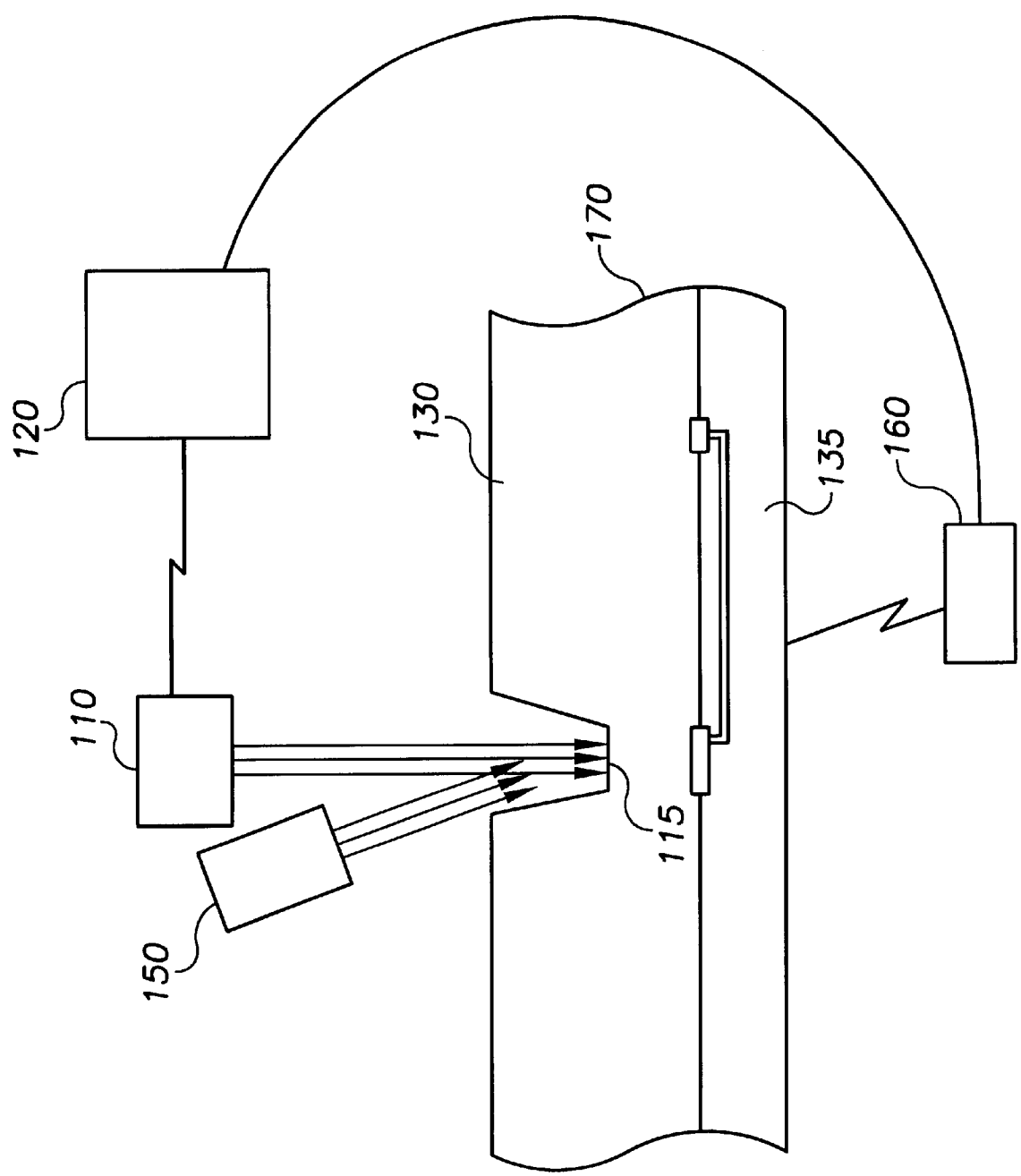
FIG. 1 shows a semiconductor device undergoing substrate removal, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for devices requiring or benefiting from back side substrate removal. While the present invention is not necessarily limited to such devices, various aspects of the invention may be appreciated through a discussion of various examples using this context.

In connection with an example embodiment of the present invention, it has been discovered that lattice structure in semiconductor devices vibrates in response to heat. This vibration can be detected and used for controlling substrate removal. According to a more particular embodiment of the present invention, a laser pulse of width 0.1–100 ns having a wavelength of about 1064 nanometers is directed at a target region in the back side of a semiconductor device and the absorption of the laser light in silicon, heats the silicon locally, causing lattice structure to vibrate. The resulting vibration, an acoustic pulse, can be detected and used to provide an indication of the amount of remaining silicon in the device.

Detecting acoustic vibration is useful for controlling substrate removal because the power spectrum of the acoustic signal is related to the amount of substrate at the target region of the layer pulse. Devices such as a transducer, piezoelectric transducer, or Sonoscan (USA of Panametrics, USA) can be used for detecting the acoustic energy. As the amount of substrate in the back side decreases, the power spectrum of the acoustic signal changes, because of the acoustic impedence offered by the remaining silicon is a function of the silicon thickness. This acoustic determination of substrate thickness aids in maintaining efficient and accurate substrate removal from the back side of semiconductor devices. In addition, this method of detecting the thickness does not necessarily require the device to be powered, nor does it necessarily require direct access to circuitry within the device.

In another particular example embodiment, a laser pulse of 0.1–100 ns pulse-width having a wavelength of about 1320 nanometers is directed at a target region in the back side of a semiconductor device. Although the absorption of this light does not generate carriers, this light is absorbed by the free carriers. This absorbed laser energy causes local heating and produces acoustic waves in silicon. As discussed herein above in connection with the 1064 nanometers laser light, the thickness of remaining substrate in the back side can be determined via acoustic analysis as substrate is removed.

Figure 2:
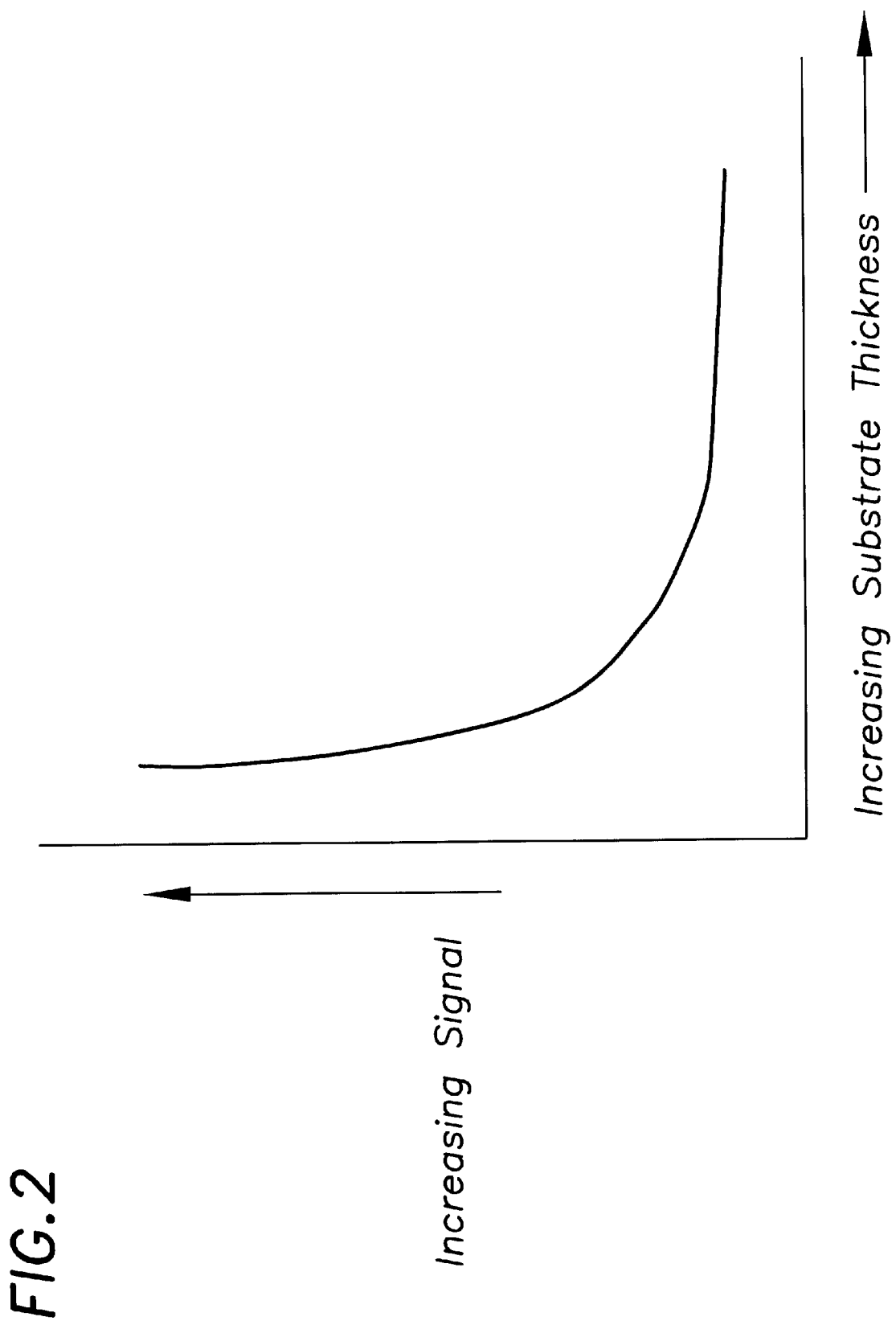
FIG. 2 is a graph showing optical beam induced current versus substrate thickness of a semiconductor device, according to an example embodiment of the present invention.

According to another example embodiment of the present invention, FIG. 1 shows substrate being removed from the back side 130 of a semiconductor device 170 using an ion bombardment device 110. An exposed region 115 is formed, and a laser beam is directed at the exposed region 115 via a laser source 150. A portion of the laser beam is absorbed in silicon and causes local heating in silicon. This in turn produces acoustic waves in silicon. The acoustic energy is detected at a transducer 160 coupled to the device 170. The transducer 160 is communicatively coupled to a controller 120, and sends a signal corresponding to the detected acoustic energy. The controller centered at a preset frequency of (~180 MHz) may, for example, employ a computer arrangement or human interaction. The signal is interpreted and correlated to the thickness of remaining substrate in between the exposed region 115 and the circuit side 135. FIG. 2 shows such an example correlation of increasing signal to substrate thickness. The controller 120 is further communicatively coupled to the ion bombardment device 110, and manages the substrate removal process by controlling the ion bombardment device 110 as a function of the correlated substrate thickness.

Figure 3:
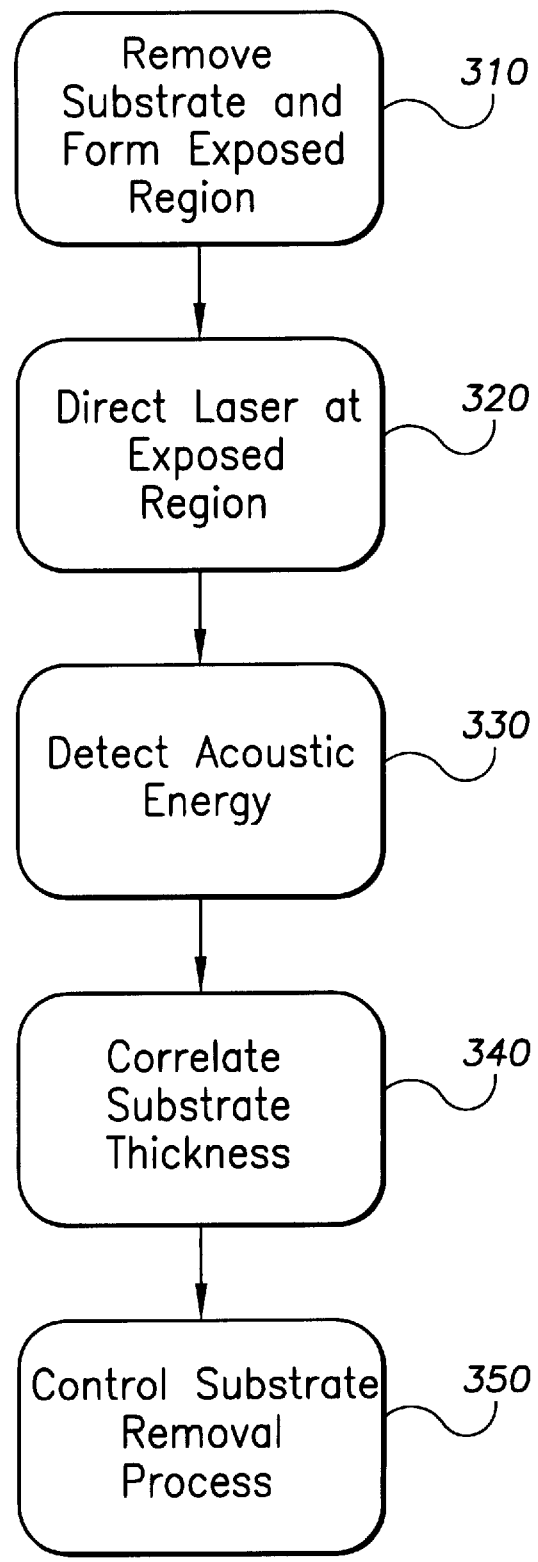
FIG. 3 is a flow diagram of a process for substrate removal in a semiconductor device, according to another example embodiment of the present invention.

FIG. 3 is a flow chart for a method of removing substrate from the back side of a semiconductor device, according to another example embodiment of the present invention. Substrate is removed at the back side of the semiconductor device at block 310 and an exposed region is formed. At block 320, a laser is directed at the exposed region. The laser contributes to the production of acoustic energy in the device, which is detected at block 330. The detected acoustic energy is used and correlated to the thickness of remaining substrate in the back side at the exposed region at block 340. The correlated substrate thickness is used at block 350 and the substrate removal process is controlled therefrom.

Figure 4:
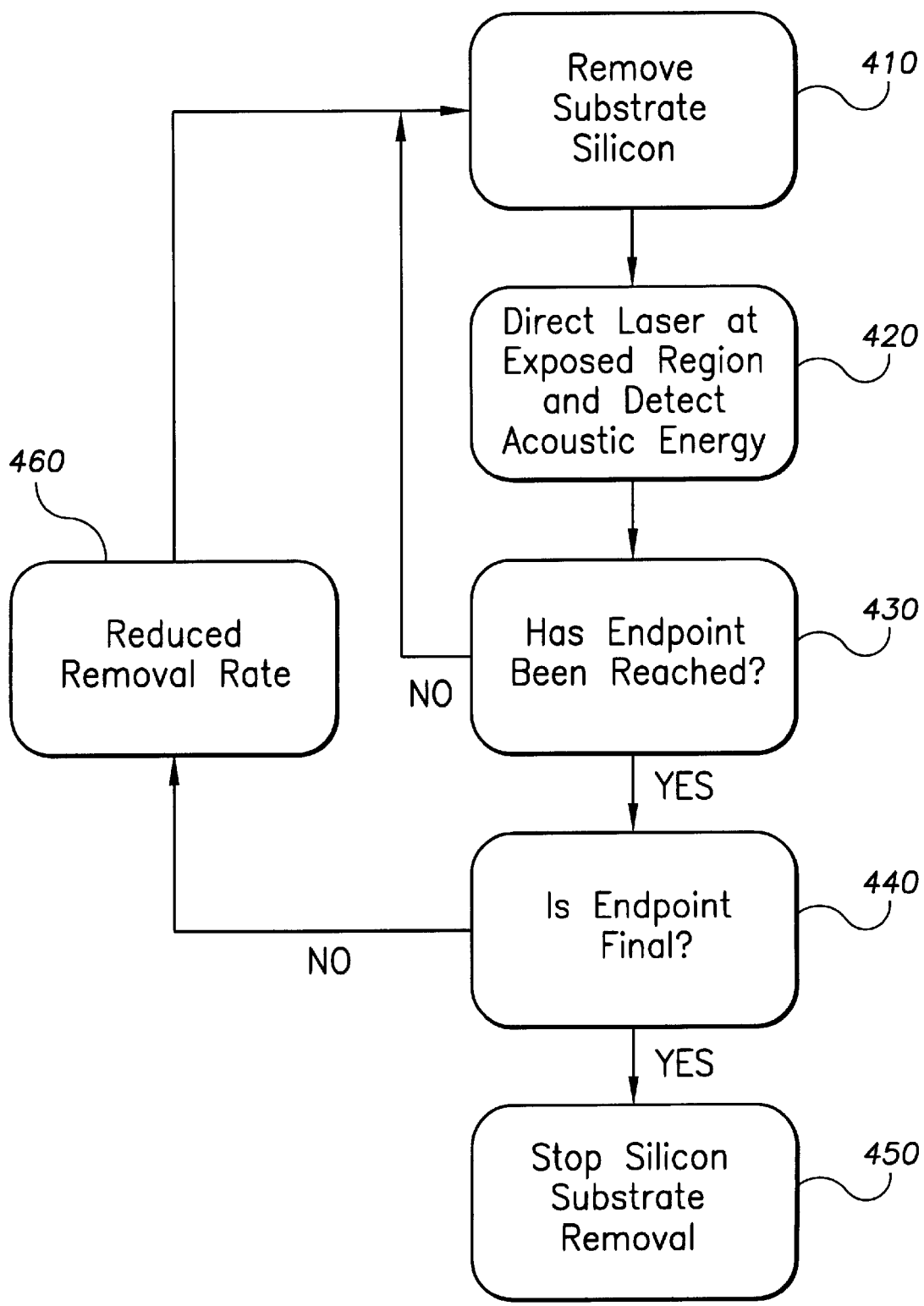
FIG. 4 is a flow diagram of a process for endpoint detection in a semiconductor device, according to another example embodiment of the present invention.

FIG. 4 is a flow chart for a method of removing substrate from the back side of a semiconductor device, according to another example embodiment of the present invention. Substrate is removed at the back side of the semiconductor device at block 410 and an exposed region is formed. At block 420, a laser is directed at the exposed region and acoustic energy is detected. The laser contributes to the production of the acoustic energy in the device. Based on the detected acoustic energy, it is determined whether an endpoint has been reached at block 430. The detected acoustic energy associated with an endpoint may correspond to a particular threshold level related to the remaining thickness in the exposed region. If the endpoint has not been reached, the process continues and substrate is removed at block 410. If the endpoint has been reached, it is determined whether the endpoint is final at block 440. If the endpoint is final, the substrate removal process is stopped at block 450. If the endpoint is not final, the substrate removal rate is reduced at block 460, the process continues, and substrate is removed at block 410.

Substrate removal may, for example, be achieved using a removal device such as a laser chemical etcher, a FIB, or other ion bombardment device. The removal device can be used at a first power level until an endpoint is reached. Upon reaching the endpoint, the power level of the removal device can be reduced, causing a reduction in the substrate removal rate. The control of the substrate removal process in this manner can improve the efficiency and accuracy of the removal process. According to a more particular embodiment, a certain endpoint is associated with nearing the end of the substrate removal process. The removal can be achieved at a high rate until that endpoint is reached. After reaching the endpoint, the substrate removal rate can be slowed for removing a small thickness of remaining substrate before the end of the substrate removal process. Once the end has been reached, the removal device is stopped. This particular embodiment allows substrate removal to occur at an initial high rate, improving the speed of the process. In addition, by using acoustic analysis, the substrate removal rate can be slowed before reaching the final end of the removal process, reducing the possibility of removing too much substrate and damaging a portion of the semiconductor device.

While the present invention has been described with reference to several particular example embodiments, those skilled in the art will recognize that many changes may be made thereto without departing from the spirit and scope of the present invention, which is set forth in the following claims.

What is claimed is:

1. A method for removing substrate from a semiconductor chip having a back side opposite circuitry near a circuit side, the method comprising detecting acoustic energy propagating through the chip; and removing a portion of substrate in the back side of the semiconductor chip as a function of detected acoustic energy propagating through the chip.

2. The method of claim 1, further comprising controlling the substrate removal responsive to the detected acoustic energy.

3. The method of claim 2, wherein controlling the substrate removal responsive to the detected acoustic energy includes stopping the substrate removal in response to reaching an endpoint.

4. A method for removing substrate from a semiconductor chip, according to claim 1, wherein removing a portion of substrate in the back side of the semiconductor chip as a function of detected acoustic energy propagating through the device comprises:

removing a portion of substrate in the back side of the semiconductor chip and forming an exposed region;

directing a laser pulse at the exposed region;

detecting acoustic energy via a transducer; and controlling the substrate removal responsive to the detected acoustic energy.

5. The method of claim 4, wherein detecting acoustic energy includes detecting acoustic energy resulting from lattice vibrations caused by the laser pulse.

6. The method of claim 4, wherein the acoustic energy resulting from the laser activity varies as a function of the substrate thickness.

7. The method of claim 4, wherein controlling the substrate removal includes programming a computer arrangement to detect the acoustic energy and to provide a control for the substrate removal.

8. The method of claim 4, wherein controlling the substrate removal responsive to the detected acoustic energy comprises:

removing substrate at a first removal rate until a point at which the detected acoustic energy reaches a first threshold level corresponding to an amount of silicon remaining in the exposed region of the back side;

reducing the removal rate to a second removal rate, responsive to reaching the first threshold level;

removing substrate at the second removal rate until the detected acoustic energy reaches a second threshold level; and responsive to reaching the second threshold level, stopping the removal process.

9. The method of claim 8, wherein removing substrate at the first removal rate includes removing substrate using a laser chemical etcher at a first power level.

10. The method of claim 8, wherein removing substrate at the second removal rate includes removing substrate using a laser chemical etcher at a second power level.

11. The method of claim 8, wherein the each of the first and second threshold levels correspond to acoustic energy values defined as a function of the silicon thickness of a portion of the semiconductor chip and the step of detecting.

12. The method of claim 8, further including using a computer arrangement programmed to respond to the detected acoustic energy, reduce the removal rate, and stop the removal process.

13. The method of claim 8, wherein reaching the first threshold level corresponds to approaching the final endpoint of the removal process.

14. The method of claim 8, wherein reaching the second threshold level corresponds to reaching the final endpoint of the removal process.

15. A method for removing substrate from a semiconductor chip having a back side opposite circuitry near a circuit side, the method comprising the steps of:

(A) detecting acoustic energy in the chip;

(B) removing substrate from the back side of the chip until a checkpoint is detected and in response thereto, adjusting the substrate removal rate;

(C) repeating step B until a final checkpoint is detected; and (D) responsive to detecting the final checkpoint, terminating the removal process.

* * * * *